(12) United States Patent
Whitefield et al.

(10) Patent No.: US 7,137,098 B2
(45) Date of Patent: Nov. 14, 2006

(54) PATTERN COMPONENT ANALYSIS AND MANIPULATION

(75) Inventors: Bruce J. Whitefield, Camas, WA (US); David A. Abercrombie, Gresham, OR (US); David R. Turner, Albuquerque, NM (US); James N. McNames, Portland, OR (US)

(73) Assignee: LSI Logic Corporation, Milpitas, CA (US)

(*) Notice: Subject to any disclaimer, the term of this patent is extended or adjusted under 35 U.S.C. 154(b) by 218 days.

(21) Appl. No.: 10/927,802

(22) Filed: Aug. 27, 2004

(65) Prior Publication Data

US 2006/0059452 A1    Mar. 16, 2006

(51) Int. Cl.
    *G06F 17/50* (2006.01)
(52) U.S. Cl. .......................................... 716/19; 716/21
(58) Field of Classification Search .................... 716/2, 716/4–5, 18, 19, 21; 714/738; 700/105
    See application file for complete search history.

(56) References Cited

U.S. PATENT DOCUMENTS

| | | | |
|---|---|---|---|
| 6,070,004 A * | 5/2000 | Prein | 716/10 |
| 6,424,929 B1 | 7/2002 | Dawes | |
| 6,986,112 B1 * | 1/2006 | Whitefield et al. | 716/4 |
| 7,013,192 B1 * | 3/2006 | Whitefield et al. | 700/105 |
| 7,039,556 B1 * | 5/2006 | Whitefield et al. | 702/183 |
| 2003/0144810 A1 | 7/2003 | Tabor | |
| 2003/0229410 A1 | 12/2003 | Smith et al. | |
| 2004/0039548 A1 | 2/2004 | Selby et al. | |
| 2004/0138846 A1 | 7/2004 | Buxton et al. | |
| 2004/0162692 A1 | 8/2004 | Ye et al. | |
| 2004/0267477 A1 * | 12/2004 | Scott et al. | 702/108 |
| 2005/0060336 A1 | 3/2005 | Abercrombie et al. | |
| 2005/0132308 A1 | 6/2005 | Whitefield et al. | |
| 2005/0227587 A1 * | 10/2005 | Yang | 451/6 |
| 2005/0278678 A1 * | 12/2005 | Whitefield et al. | 716/12 |
| 2006/0031788 A1 * | 2/2006 | Bauer | 716/1 |
| 2006/0059452 A1 * | 3/2006 | Whitefield et al. | 716/20 |
| 2006/0085155 A1 * | 4/2006 | Miguelanez et al. | 702/118 |

* cited by examiner

*Primary Examiner*—Stacy A. Whitmore
(74) *Attorney, Agent, or Firm*—Luedeka, Neely & Graham, P.C.

(57) ABSTRACT

A method for determining component patterns of a raw substrate map. A subset of substrate patterns is selected from a set of substrate patterns, and combined into a composite substrate map. The substrate patterns are weighted. The composite substrate map is compared to the raw substrate map, and a degree of correlation between the composite substrate map and the raw substrate map is determined. The steps are iteratively repeated until the degree of correlation is at least a desired degree, and the weighted subset of substrate patterns is output as the component patterns of the raw substrate map.

20 Claims, 5 Drawing Sheets
(5 of 5 Drawing Sheet(s) Filed in Color)

PATTERN COMPONENT ANALYSIS AND MANIPULATION

FIELD

This invention relates to the field of substrate processing, such as integrated circuit fabrication. More particularly, this invention relates to modeling pattern information with individual components of the patterns to identify and correct processing problems.

BACKGROUND

Modern integrated circuits are extremely complex devices that are fabricated using equally complex processes. As the term is used herein, "integrated circuit" includes devices such as those formed on monolithic semiconducting substrates, such as those formed of group IV materials like silicon or germanium, or group III–V compounds like gallium arsenide, or mixtures of such materials. The term includes all types of devices formed, such as memory and logic, and all designs of such devices, such as MOS and bipolar. The term also comprehends applications such as flat panel displays, solar cells, and charge coupled devices. Because of the complexity of integrated circuits and the processes by which they are formed, it can be extremely difficult to determine the reasons why some devices function properly and other devices function improperly, or fail altogether.

Integrated circuits are typically manufactured on thin silicon substrates, commonly referred to as wafers. The wafer is divided up onto smaller rectangular sections for each device, typically known as the die or device. The methods and other embodiments according to the present invention can be applied to processes that are performed on other substrates to make other devices or components, such as flat panel display manufacturing, which is performed on rectangular glass substrates. Thus, this disclosure generally refers to substrates, substrate profiles, and substrate contact points, even though silicon wafer processing may be the most common application for the embodiments of the invention. It is appreciated that the same or similar methods are just as applicable to the analysis of a wide variety of substrates. Wafer test yield of die, or simply yield, is predominantly used as an example herein of an important dependent variable of interest. However, it is appreciated that any other dependent variable that is spatially associated with the substrate can also be used.

One method to assist in failure analysis is mapping important variables, such as yield, according to the position at which the variable is read on the substrate. Wafer mapping, for example, has traditionally been done by plotting the pass/fail data (i.e. yield) or other variable of interest versus the die position on the wafer. These wafer maps can be enhanced by combining values from many wafers in what is known as a stacked map. Recently there have been improvements in substrate mapping that can combine data from many wafers and many devices into what is known as a high-resolution wafer profile. Such substrate profiles are created from databases of information that is associated with substrates.

A graphical representation is developed from the information, which representation depicts the yield or other variable read from the devices on the substrate, according to their position on the substrate. Substrate profiles such as these look somewhat like a topographical map, where the various contours of the profile delineate areas of different average (or otherwise computed) yield or other measured variable of interest for the devices bounded by those contours on the substrates. Another common data display approach is to use a different color to represent die or contours of the wafer having similar values. The methods described herein can be used with standard wafer maps, stacked wafer maps, or substrate profiles.

Yields on substrates, such as for integrated circuits on wafers, frequently follow patterns across the substrate. Analysis of the pattern of yield or other measured parameters on the substrates is useful in determining the source of process variations or yield loss. An observed pattern can sometimes be matched against the physical characteristics of a process in the integrated circuit fabrication process, or against previously known patterns that the processes can produce. It is appreciated that in many instances herein, the term "map" includes both maps and profiles as described above. It is also appreciated that the term "yield" as used herein generally includes a variety of concepts in addition to pass/fail yield, such as reliability data, measured electrical properties, customer return data, and final test data, to name a few.

One problem that often limits the usefulness of substrate pattern analysis is that the actual pattern being observed is in reality a combination of the patterns created by many processes during the processing of the substrates. A clear pattern is usually only observed if one pattern source has a much stronger effect than any of the other pattern sources that exist in the data sample set. Otherwise, clear patterns tend to cancel each other out. For example, the pattern of yield loss towards the edges of the substrate caused by one operation may be hidden by a pattern for yield loss towards the center of the substrate that is caused by another operation, making the final pattern appear to be uniformly low, rather than the combination of two separate problems.

One method that is typically used to attempt to improve the identification of substrate patterns is to use the data from only selected substrates, in an effort to eliminate multiple or conflicting patterns, and to then hope that any patterns that do exist will thereby stand out. Another method is to display a substrate map for different measurements, such as leakage values or driver currents instead of yield averages, in order to improve the definition of the yield patterns for specific problems.

However, the problems with the typical approaches given above are that none of them addresses the fundamental issue that there are typically multiple and conflicting patterns existing within the data that is gathered from any significant number of substrates. This situation arises, for example, from the more than three hundred process steps that are performed on a semiconductor wafer during the typical fabrication cycle of an integrated circuit. Further, a measurable parameter that provides a better pattern signal than average yield may not be available, or may not be tested on all devices.

What is needed, therefore, is a system for constructing, using, or interpreting substrate maps that reduces some of the problems mentioned above.

SUMMARY

The above and other needs are met by a method for determining component patterns of a raw substrate map. In this procedure, a subset of known substrate patterns combined into a composite substrate map and compared to an actual substrate map. First, a subset of substrate patterns is selected from the set of possible substrate patterns. Each component substrate pattern is then weighted according to a weighting function. The patterns are then converted to a data matrix form so that they can be orthogonalized, redundant component patterns eliminated, and combined into a composite substrate map, sometimes called a synthetic substrate map herein. The composite substrate map is then compared to the raw substrate map, and a degree of correlation between the composite substrate map and the raw substrate map is determined. The steps are iteratively repeated until the degree of correlation is at least a desired degree, and the weighted subset of substrate patterns is output as the component patterns of the raw substrate map.

A slightly modified procedure can be utilized to create synthetic substrate maps which have properties similar to those seen in actual manufactured substrates, but have the added benefit of precisely known pattern components. Such synthetic substrate maps can be useful for testing software algorithms and systems that work with substrate data, without having to collect actual data, or when data with larger variation than normally available is needed. In this case a similar procedure to that described above is used, except the weighting of the component patterns is selected randomly or is defined by the user, and a random or selected weight of a random component pattern is included in the combined substrate map.

In this manner, the preferred methods according to the present invention enable an engineer to determine the various component influences on the substrate map, which may be, in various embodiments, an indication of the yield on the substrate. These influences can be ranked according to predominance, and the problems associated with the influences can be tracked down and corrected. Thus, certain influences, that may be obscured or confounded by other influences, can be detected and their associated processing problems discovered and corrected.

The set of substrate patterns preferably includes those that occur in the manufacturing processes, which for integrated circuit substrates (wafers) typically include reticle patterns, planar patterns such as a right to left gradient, and radial patterns such as donut, edge ring, and center spot. The mathematical descriptions of the component patterns preferably include at least one of cross exposure or reticle field, constant value, planar, quadratic, cubic, quartic, quintic, sextic, septic, octic, and higher-order polynomials, third order radial, fourth order radial, fifth order radial, and higher-order radial.

The comparison between the composite substrate map and the raw substrate map is preferably an automated mathematical comparison, but may in other embodiments be a manual visual comparison. The method is preferably performed without user intervention on a computer. Preferably, the raw substrate map is created by collecting sets of substrate data normalizing a value scale of the sets of substrate data, normalizing a location scale of the sets of substrate data, and combining the normalized sets of substrate data into the raw substrate map. The location scale preferably includes x-y coordinates on the substrate The component patterns are preferably ranked according to their degree of influence, where the degree of influence of each of the component patterns is most preferably based at least in part on the weighting used for each of the component patterns Preferably, the component patterns are associated with processing problems, and the processing problems associated with the component patterns are corrected.

Thus, the data preferably consists of some measure taken from different sites on the substrate, where the spatial x-y coordinates of these measurements are preferably known. The user, or some other system, preferably selects which components are to be estimated using the method. The method is used to estimate how much of the total variation in the data is explained by each of the components used in the estimation process. This permits the components to be ranked in order of the total variation explained. The various preferred embodiments of the present invention improve the ability to identify the sources of the various factors that influence important substrate parameters, like yield, by calculating and displaying the component patterns that exist within the raw data.

The generation of artificial substrate maps is preferably an automated process, but may in other embodiments be a manual calculation. The method is preferably performed without user intervention on a computer. Preferably, the artificial substrate map is created by the user selecting the normalizing scale and component patterns of interest and either assigning a weighting function or allowing a random weighting between proscribed limits. A computer program would then build the substrate data matrix and perform orthogonalization, such as with a QR decomposition. The resulting component patterns are combined with a user or system defined signal to noise ratio, such as one of random variation, to create the substrate data set. The component and composite or combined patterns are preferably plotted using the normalized scale and standard graphic visualization techniques.

Thus, the various preferred embodiments of the present invention improve the ability to create substrate maps that are highly similar to those generated by actual processes, but have known component pattern levels and do not require the manufacturing or testing of actual substrates to be obtained.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

Further advantages of the invention are apparent by reference to the detailed description when considered in conjunction with the Figs., which are not to scale so as to more clearly show the details, wherein like reference numbers indicate like elements throughout the several views, and wherein.

DETAILED DESCRIPTION

Figure 1:
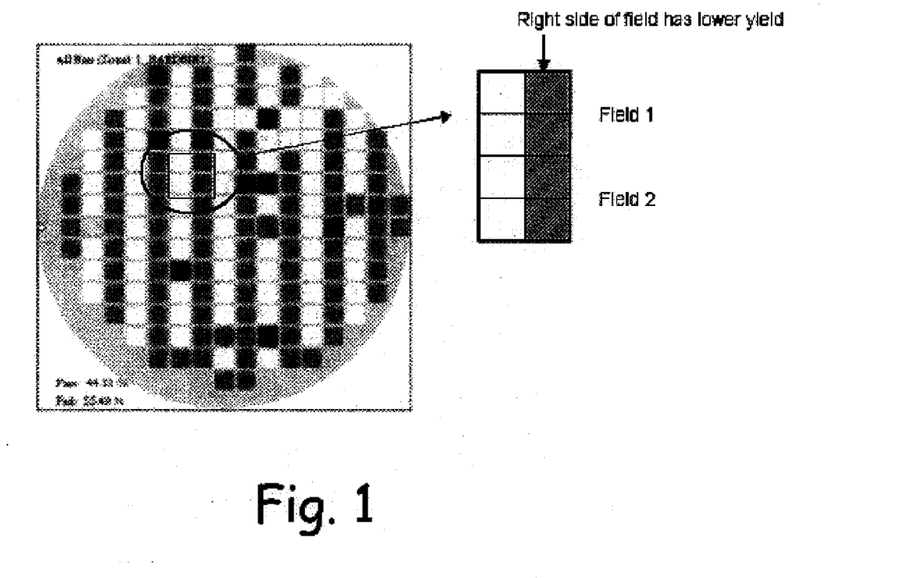
FIG. 1 depicts a substrate map with a striping pattern, such as a typical pattern of an across exposure reticle variation.
Figure 2:
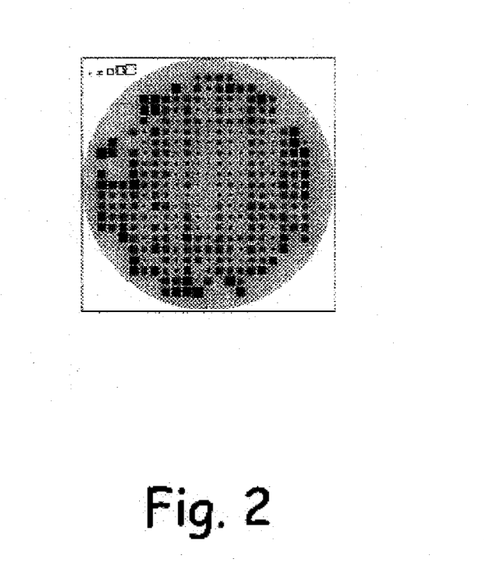
FIG. 2 depicts a substrate map with a radial pattern.

With reference now to FIG. 1, there is depicted an example of a striping pattern that is typical of a variation in focus occurring during a stepped lithographic exposure process. In the substrate map as depicted in FIG. 1, the white boxes represent locations where the devices exhibit at least a standard level of yield, while boxes of other color represent locations where the devices exhibit a level of yield that is lower than the standard level. FIG. 2 depicts an example of a center to edge radial pattern that is typical of many thin film deposition or etching processes. In the example of FIG. 2, the size of the square at various locations on the map is proportional to the historical yield of the devices at that location. If the yield patterns of these two figures are combined, for example, it becomes difficult to discern the nature of the problems associated with the yield patterns. Thus, it is a goal of the embodiments of the present invention to resolve overall patterns, such as yield patterns, into components such as these.

There are several steps in the preferred methods according to the present invention, including the major steps of: 1) collecting the data of interest, 2) normalizing the data scales, 3) generating a raw substrate map, 4) selecting the various component patterns, 5) modeling the substrate patterns, 6) reselecting the component patterns, and 7) ranking the component pattern influences. Each of these steps is described in greater detail below.

Collect the Data of Interest

The various and selectable substrate data are selected first, according to the preferred methods of the invention. The data can include all available data, or selectable subsets of data. Preferably, the data has a common value scale and is associated with location information relative to where it was collected on the substrates, such as with x-y coordinates. In a most preferred embodiment, the data is selected from a database of substrate yield data, such as an engineering database. A wide variety of data can be selected for this purpose, including without reservation information such as pass/fail yield, layer thickness, and leakage current.

Normalize the Scales

A die size or site scale is preferably defined, and the data is preferably normalized to that location scale. The scale used is most preferably the die size itself, and if the data collected is for every die on the substrate, then this step is accomplished inherently. The data values may, in some embodiments, be a simple 0 to 1 scale, although any scale system can be used. When combining measurements from substrates with different die sizes or data that is not mapped to die sites, such as bare substrate measurements, then the combining and normalizing steps are not inherently performed within the dataset itself, but are preferably affirmatively performed on the dataset.

Generate the Raw Substrate Map

Figure 3:
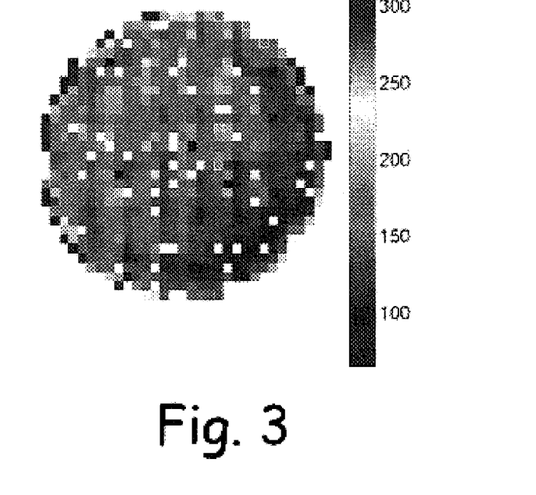
FIG. 3 depicts a substrate map with an unknown combination of patterns.

A substrate map of the raw dataset is preferably generated. FIG. 3 depicts an example of a substrate map created from Iddq data, where the x-y scale is the same as the die size on the substrate, and the value scale ranges from a low value to a high value. Most preferably the map is presented with a color scale for quick and easy interpretation of the map.

Select the Component Patterns

The component patterns of interest for analysis are preferably selected. In substrate processing, there are typically only a relatively few component patterns that are of interest, which situation is usually due to the nature of how substrates are processed. However, this phenomena can be advantageously used to limit the number of component pattern types that are considered by the model according to the present invention. The list of the more common patterns is given below:

a. Cross exposure field (reticle) variation (This causes stripes or checkerboard variation depending on the number of die per exposure field, commonly known as a reticle),
b. Radial dependency,
c. Donut,
d. Edge ring,
e. Center spot,
f. Cross substrate variation right to left,
g. Cross substrate variation top to bottom,
h. Cross substrate variation at a 45 deg bottom to top, and
i. Cross substrate variation at a 45 deg top to bottom.

For each component pattern of interest, a mathematical formula is preferably used in the model calculation. The function that is used for each pattern of interest is preferably previously established in the data system, based on an experimental analysis of what function works best to simulate the pattern of interest. In this manner, the user need only select the pattern they are interested in modeling. In some embodiments, multiple calculation methods are available. In the example as given herein, a total of three patterns of interest and corresponding model functions are selected for analysis, including cross exposure field, radial, and donut.

The coefficients for all of the components are preferably calculated in the same manner. Essentially, a mathematical model is created that describes the systematic variation. The model contains parameters that are preferably estimated from the data. These parameters are estimated to reduce and preferably minimize some measure of difference between the model and the actual data.

The preferred methods of constructing the mathematical models of the patterns are now explained in greater detail.

Generating Reticle Component

The statistical model for the reticle component can be expressed as follows:

$$Z_{reticle} = \sum_{i=1}^{n} r_i I_i(x, y) + \varepsilon \qquad (1)$$

where n is the number of dies in the reticle, $\varepsilon$ is a random variable that represents the random variation, $r_i$ is coefficient for reticle component, and $I_i(x,y)$ is an indicator function that is one when $(x,y)$ is in the $i^{th}$ reticle position and zero otherwise. In general, the reticle indicator $I_i(x,y)$ is the function of die location x and y, and can be expressed as a matrix of the form:

$$I = \begin{bmatrix} 1 & 0 & 0 & 0 & 0 & 0 & 0 & 0 & 0 & 0 & 0 & 0 \\ 0 & 0 & 0 & 0 & 0 & 0 & 0 & 1 & 0 & 0 & 0 & 0 \\ 0 & 0 & 1 & 0 & 0 & 0 & 0 & 0 & 0 & 0 & 0 & 0 \\ 0 & 0 & 0 & 0 & 0 & 0 & 1 & 0 & 0 & 0 & 0 & 0 \\ 0 & 0 & 0 & 0 & 0 & 0 & 0 & 0 & 0 & 1 & 0 & 0 \\ 0 & 0 & 0 & 0 & 0 & 0 & 0 & 0 & 0 & 0 & 0 & 1 \\ 0 & 1 & 0 & 0 & 0 & 0 & 0 & 0 & 0 & 0 & 0 & 0 \\ 0 & 0 & 0 & 0 & 1 & 0 & 0 & 0 & 0 & 0 & 0 & 0 \\ \vdots & \vdots & \vdots & \vdots & \vdots & \vdots & \vdots & \vdots & \vdots & \vdots & \vdots & \vdots \\ 0 & 0 & 0 & 0 & 0 & 0 & 0 & 0 & 1 & 0 & 0 & 0 \end{bmatrix}$$

The number of columns is represents the number of die in a reticle and the number of rows is equal to the number of sites where measurements are taken. For example, if a substrate includes 500 patterns and a reticle processes 12 patterns at a time, the reticle index can be expressed with a 500×12 dimension matrix.

This matrix has two important properties. First, each row preferably has only one column that is assigned a value of 1, because each pattern is in only one reticle position. Thus, the sum across any single row is preferably always 1. In contrast, the sum of each column preferably varies depending on how many patterns fall in each reticle position. Second, each column vector is preferably orthogonal to all of the other column vectors. Thus, the inner product of any column vector with any other column vector is preferably always zero. The significance of these properties is explained in greater detail hereafter.

Generating Polynomial Components

In practice, the systematic variation can be localized and their curvatures can be expressed as a function of the measurement site index by x and y coordinates. Each substrate processing tool is generally capable of generating uniquely localized systematic variation. Thermal gradients and Chemical Mechanical Polishing, for example, can cause variation that is well explained by a polynomial function of the x and y coordinates. Up to five or more orders of polynomial components can be used, including linear (planar), quadratic, cubic, quartic, and quintic components. The linear component is a linear combination of x and y and has no interaction term. The quadratic component has two squared terms and an interaction term. The cubic and higher order components are constructed in a similar manner as that already explained. The statistical model for each polynomial component can be expressed as:

$$Z_{polynomial} = \sum_{i=1}^{n} p_i f_i(x, y) + \varepsilon \qquad (2)$$

where n is the number of polynomial components, $\varepsilon$ is a random variable that represents the random variation, $p_i$ is coefficient vector for polynomial component, and $f_i(x,y)$ is a polynomial component function. The number of coefficients for each polynomial component is preferably exactly one more than the order of the polynomial.

Generating Radial Components

Some tools, such as those that use centripetal force to spread a thin layer of photoresist or some other chemical across a substrate, can cause radial patterns. Doughnut and Bull's-eye patterns are common examples of radial patterns. Radial components are a function of radius R and tend to vary only as a function of distance from the center of the substrate. The statistical model for the all of the radial components is preferably:

$$Z_{radial} = \sum_{i=2}^{n} d_i R^i + \varepsilon, \quad \text{where } R = \sqrt{x^2 + y^2} \qquad (3)$$

where n is the number of radial components, $\varepsilon$ is a random variable that represents the random variation, $d_i$ is coefficient for the ith radial component, and R is radius of the measurement site from the center of the wafer. Note that the first term included in this sum is of second order. The first order term is preferably always omitted because it causes a discontinuity at the center of the substrate that typically does not occur in practice.

Statistical Modeling

In statistical process control, point statistics such as mean and variance are typically used to quantify substrate variations. Using point statistics, a complete statistical substrate variation model can be constructed by combining the three types of systematic variation (1), (2), and (3), as given above, as:

$$Z_{\text{Full\_Model}} = \sum_{i=1}^{n} r_i I_i(x, y) + \sum_{i=1}^{n} p_i f_i(x, y) + \sum_{i=1}^{n} d_i R^i + \varepsilon \qquad (4)$$

Matrix algebra is widely used for statistical analysis, as it permits the statistical model or large array of data to be denoted compactly and operated efficiently. The model (4) is preferably expressed as a system equation, by:

$$Z = Ab + \varepsilon \qquad (5)$$

where b is a vector containing individual coefficients. A is an indicator matrix that can be constructed like the following form, $$A = \begin{bmatrix} 1 & I_{11} & I_{21} & \cdots & I_{nI} & X_1 & Y_1 & X_1^2 & X_1Y_1 & Y_1^2 & \cdots & X_1Y_1^{n-1} & Y_1^n & R_{11} & R_{21} & \cdots & R_{nI} \\ 1 & I_{12} & I_{22} & \cdots & I_{n2} & X_2 & Y_2 & X_2^2 & X_2Y_2 & Y_2^2 & \cdots & X_2Y_2^{n-1} & Y_2^n & R_{12} & R_{22} & \cdots & R_{n2} \\ 1 & I_{13} & I_{23} & \cdots & I_{n3} & X_3 & Y_3 & X_3^2 & X_3Y_3 & Y_3^2 & \cdots & X_3Y_3^{n-1} & Y_3^n & R_{13} & R_{23} & \cdots & R_{n3} \\ \vdots & \vdots & \vdots & \vdots & \vdots & \vdots & \vdots & \vdots & \vdots & \vdots & \vdots & \vdots & \vdots & \vdots & \vdots & \vdots & \vdots \\ 1 & I_{1n} & I_{2n} & \cdots & I_{nn} & X_n & Y_n & X_n^2 & X_nY_n & Y_n^2 & \cdots & X_nY_n^{n-1} & Y_n^n & R_{1n} & R_{2n} & \cdots & R_{nn} \end{bmatrix}$$

Multicollinearity

The indicator matrix A does not have full column rank. This problem, called multicollinearity, makes it difficult to estimate the model coefficients accurately, because a pattern cannot be properly detected if one component pattern is correlated to others. A specific example is the radius squared. This is equal to $R^2=x^2+y^2$, which can be represented with a quadratic polynomial. Low order components are dominant in both polynomial and radial components. In other words, as the component's order increases, high order components become difficult to estimate. Visually, the higher order radial components ($3^{rd}$, $4^{th}$, $5^{th}$, and $6^{th}$) are nearly indistinguishable.

Orthogonalization

An alternative method to overcome the multicollinearity is to use orthogonal polynomials. This is preferably achieved by a linear transformation of the data matrix A such that the columns of the new matrix are orthonormal. If all components are centered (by subtracting their means) and orthogonalized, all the components are uncorrelated. There is a useful matrix factorization, called QR decomposition, which provides this transformation, as given by:

$$A=Q\cdot R \quad (6)$$

$$Q^T\cdot Q=1 \quad (7)$$

Here R is an upper triangular matrix and Q is an orthogonal matrix, where each column vector of Q is an orthonormal basis vector. Although the decomposition exists for a general rectangular matrix, the present method is preferably restricted to cases in which the matrix is square or has more rows than columns, indicating that the number of sample locations is greater than the number of the coefficients. Like other matrix factorizations, such as singular value decomposition, QR decomposition can be used to solve systems equations.

After orthogonalization, the high order polynomial and radial components show distinct patterns. However, multicollinearity continues to cause problems. The left and right edges of the reticle component are still corrupted as are the 2nd and 4th order radial components. This occurs because the constant component is collinear with the reticle components, recalling that each row of the reticle indicator variables sum to 1—the same as a constant component. Similarly, the 2nd and 4th order radial components are collinear with the 2nd and 4th order polynomials. The reason why the $6^{th}$ radial component shows a distinct pattern is that the model does not contain the same order ($6^{th}$) polynomial component. When these redundant components are eliminated, these problems disappear due to multicollinearity.

Figure 5:
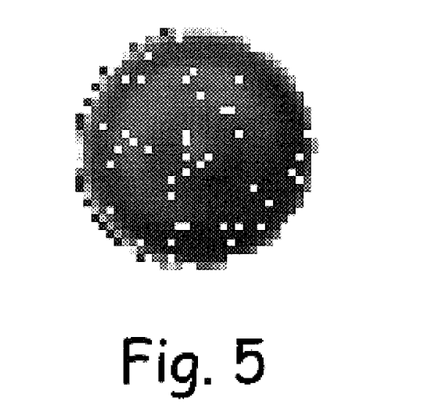
FIG. 5 depicts a combined polynomial substrate pattern and radial substrate pattern, where the weighting mask of FIG. 4 has been applied.
Figure 6:
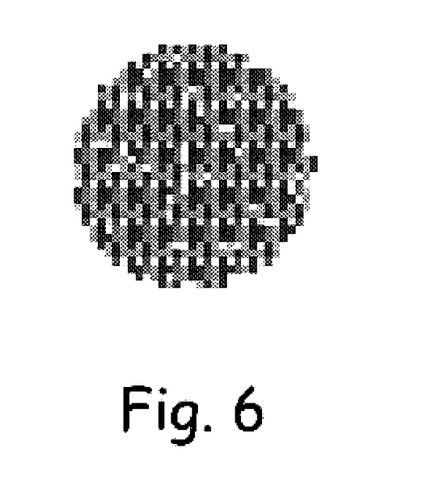
FIG. 6 depicts a reticle or striped substrate pattern, where the weighting mask of FIG. 4 has been applied.

The radial and donut patterns are depicted in FIG. 5, such as with contour lines. However, it is appreciated that in most embodiments the actual map would not be in a profile form, but would be in a non-smoothed map format. The profile depiction of FIG. 5 is presented for clarity, given the limitation of the drawn figures. The reticle variation pattern is depicted in FIG. 6. Again, it is appreciated that in actual implementation, the resolution of the substrate map would tend to be higher, and have a greater number of gradations that are presented in FIG. 6, which is made for the purposed of a representative example only.

Model the Substrate Patterns

Utilizing a weighting function, the original pattern is preferably modeled using the component functions as selected. In this example, a Huber weighting function and Iterative Reweighted Least Squares method is preferably employed. It is appreciated that other weighting functions and methods can be used, as desired or appropriate. The Huber weighting function is preferably used to reduce the impact of outlier data points on the model. The Iterative Reweighted Least Squares method is preferably used to achieve a good convergence of the model with the raw pattern. The Iterative Reweighted Least Squares method has been found to work well on substrate based data, although other methods could also be used. An ordinary least squares method is preferably employed when the data does not contain outliers.

Figure 4:
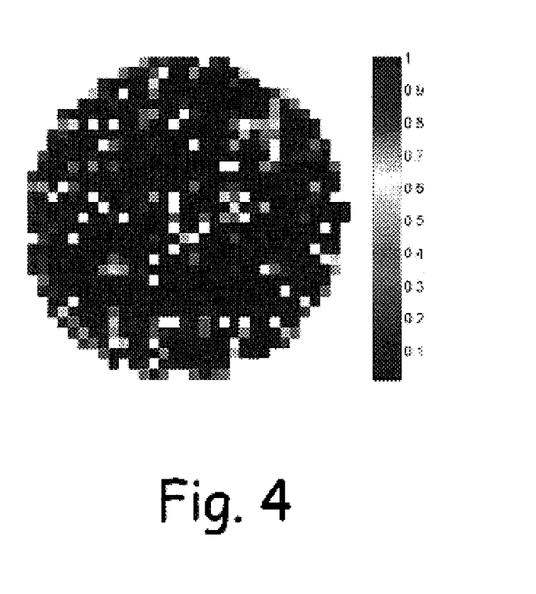
FIG. 4 depicts a visual representation of a mathematical weighting of substrate map data.

FIG. 4 depicts a map of the weights by location on the substrate as applied by the weighting function, which in the preferred embodiments is a Huber weighting function. As depicted in FIG. 4, the color scale represents the weight that a given data point will have in the model. Outlier data points are preferably given a low weight. In actual implementation, the weighting function may be applied with a finer resolution and with a greater number of gradations.

The process steps as described above are preferably iterated, with different patterns being selected, weighted, and combined, until the combined and weighted patterns approximate the raw substrate map as depicted in FIG. 3 to a desired degree. If a map of a given weighted combination does not match the raw substrate map to the desired degree, then another iteration is performed. Most preferably, this process is all accomplished on a computer that is programmed to do the selecting and matching based on pattern recognition technology. However, in alternate embodiments, the method can be performed manually. Depending upon the error measurement used, no iterations may be necessary. For example, iterations tend to not be required when using a sum of squares error measurement.

Figure 7:
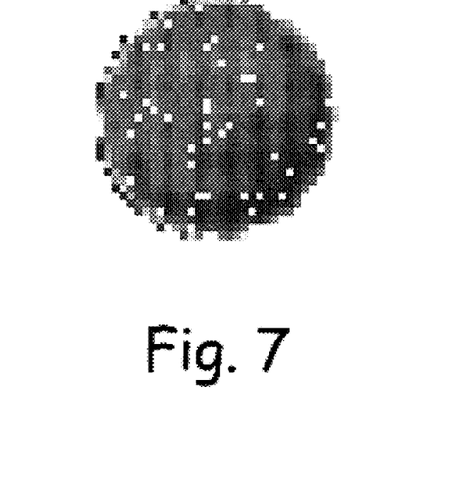
FIG. 7 depicts a combination of weighted patterns of FIGS. 5 and 6, which is the final model of the raw data depicted in the substrate map of FIG. 3.
Figure 8:
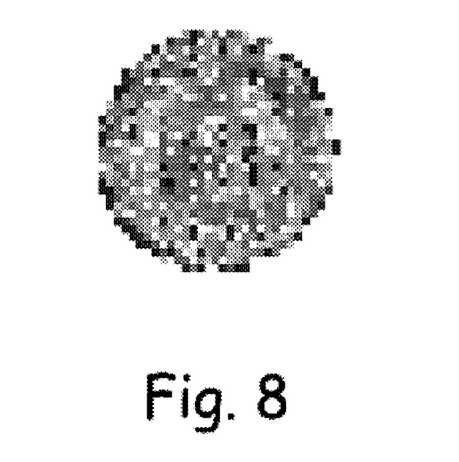
FIG. 8 depicts a graphical representation of the degree of correlation between the modeled substrate pattern of FIG. 7 and the raw data substrate pattern of FIG. 3.

FIG. 7 depicts a component substrate map that is the result of the iterations described above. FIG. 8 depicts the residuals of a comparison of the component model map to the original raw substrate map, where the values at each location of one are subtracted from the values at the same location of the other. In the example as depicted in FIG. 8, the component map matches the raw substrate map quite well, with an $r^2$ value of about eighty percent. It is appreciated that the maps as depicted in FIGS. 7 and 8 are somewhat simplified from those that would be used in the preferred embodiments, so as to not unduly burden the drawings with detail that does not significantly add to an understanding of the invention.

It is further appreciated that the iterations described above can be continued until a better correlation or degree of correlation is found between the actual map and the model map, or stopped before the correlation is this good. It is further appreciated that other methods that measure degree of correlation could also be used. In the example as depicted, the exposure field tends to have a significant effect on the Iddq values. In addition, there is a significant crescent pattern occurring in the lower right portion of the substrate.

Reselect the Component Patterns

After the model results are completed, the user preferably examines the resulting component patterns for accuracy. If the match is adequate, as described above, then the user preferably uses the data for further analysis of the fabrication process, as desired. In the example above, the user may want to investigate the source of the cross field problem. This could be done in one embodiment by rerunning this same analysis using maps that are generated only from substrates that were run on certain lithographic systems, and comparing the results from the individual systems to determine which lithography tool is the source of the pattern.

If the match is not adequate, the model is preferably rerun with a different set of component patterns. In the example above, the user my be interested in including an edge ring component, as some indication of such is evident in the residuals map.

Rank the Component Influences

Once the model results are deemed adequate as to degree of correlation, the individual component influences on the model can be ranked mathematically. This is useful in using the system in an automated mode. The component influence values can be calculated on a regularly occurring basis and then plotted, such as by using standard statistical process control charting methods. In this manner, the emergence of a problem pattern, such as the edge ring, can be monitored and controlled independently of other patterns that may appear on the substrates. Thus, the methods as described can be accomplished in a completely automated fashion. However, in other embodiments the methods can be performed manually.

The present invention has many aspects which define over the prior art. The system according to the preferred embodiments of the present invention mathematically separates a substrate pattern into major component patterns, in order in improve the ability to recognize patterns and isolate the errant process that is causing the pattern. The pattern components are modeled to simulate processing problems. The pattern components are combined to approximate the raw substrate map to a desired degree. Huber weighting and Iterative Reweighted Least Squares methods are preferably used as part of the modeling process, to improve the degree of correlation. A component influence value is preferably calculated to enable monitoring of the trend of the patterns that influence the map levels.

Figure 9:
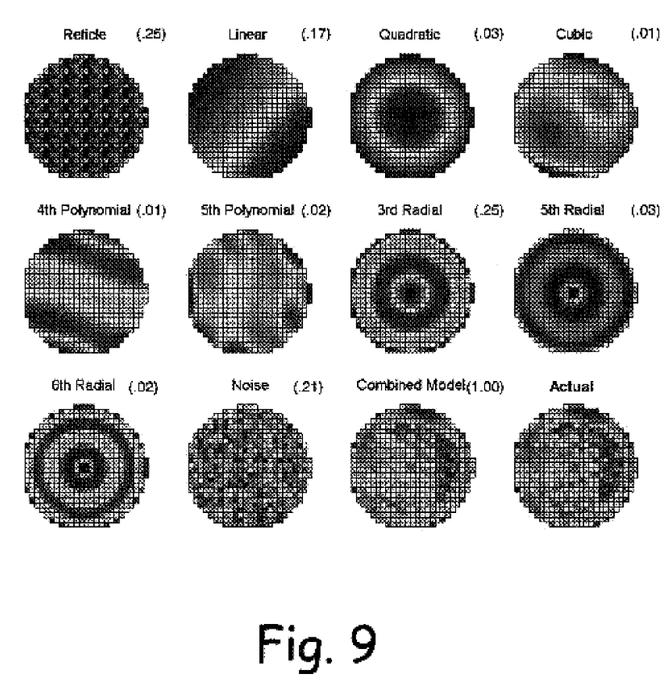
FIG. 9 depicts a collection of graphical representations of a pattern, its component patterns, and the simulated composite pattern, along with each component pattern's relative power within the composite pattern.

FIG. 9 shows a collection of graphical representations of a pattern, its component patterns, and the simulated composite pattern, along with each component pattern's relative power within the composite pattern. This collection of final component patterns lets the user see at a glance the shape and relative influence of each component pattern, and the degree of residual pattern between the simulated and actual composite patterns.

The preferred embodiments of the present invention provide better resolution and recognition of spatial patterns on substrates than that which is provided by merely mapping the raw measurement or yield data alone. With the present methods, systematic substrate patterns are more clearly separated from the noise that is caused by random variations and defects. Various embodiments can be used as partitioning tools to investigate the sources of patterns during the manufacturing process.

The percent and magnitude of component patterns is preferably monitored independently and directly for process control and corrective action purposes. This is a distinct advantage over current statistical process control practices, which must reduce the pattern to a few numbers, such as substrate mean and range, in order to plot them on a control chart. What is frequently of greater interest is whether a particular pattern of interest is emerging, which pattern may signify an impending failure. One example of such is an plasma oxide etch process, where uniformity failure often starts with the very edge of the substrate etching too fast. In this case, monitoring for the degree of an edge ring pattern will catch a failing process chamber more quickly than just monitoring the range of etch values as they vary across the substrate. Conversely, a higher range may still be acceptable for manufacturing, as long as it did not take the form of the edge ring pattern that signified an impending failure.

Many different approaches to the weighting function and the modeling calculation described above can be employed. This invention can be applied to other types of manufacturing where site-based data is available and pattern analysis is desirable, such as flat panel display manufacturing. Additional component patterns of interest beyond those listed could also be used, or given different names.

The foregoing description of preferred embodiments for this invention has been presented for purposes of illustration and description. It is not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method for determining component patterns of a raw substrate map, the method comprising the steps of:
   a) selecting a subset of substrate patterns from a set of substrate patterns,
   b) combining the subset of substrate patterns into a composite substrate map,
   c) weighting the substrate patterns in the subset of substrate patterns,
   d) comparing the composite substrate map to the raw substrate map,
   e) determining a degree of correlation between the composite substrate map and the raw substrate map,
   f) iteratively repeating steps a through e until the degree of correlation is at least a desired value, and
   g) outputting the weighted subset of substrate patterns as the component patterns of the raw substrate map.

2. The method of claim 1, wherein the set of substrate patterns includes at least one of cross exposure field, radial dependency, donut, edge ring, center spot, right to left gradient, top to bottom gradient, angled top to bottom gradient, and angled bottom to top gradient.

3. The method of claim 1, wherein the comparison between the composite substrate map and the raw substrate map is a manual visual comparison.

4. The method of claim 1, wherein the comparison between the composite substrate map and the raw substrate map is an automated mathematical comparison.

5. The method of claim 1, wherein the method is performed without user intervention on a computer.

6. The method of claim 1, wherein the raw substrate map is created by:
   collecting sets of substrate data,
   normalizing a value scale of the sets of substrate data,
   normalizing a location scale of the sets of substrate data, and
   combining the normalized sets of substrate data into the raw substrate map.

7. The method of claim 6, wherein the location scale comprises x-y coordinates on the substrate.

8. The method of claim 1, further comprising the step of ranking the component patterns according to their degree of influence.

9. The method of claim 8, wherein the degree of influence of each of the component patterns is based at least in part on the weighting used for each of the component patterns.

10. The method of claim 1, further comprising the step of associating the component patterns to processing problems.

11. The method of claim 10, further comprising the step of correcting the processing problems associated with the component patterns.

12. A method for ranking degrees of influence of component patterns on a raw substrate map, the method comprising the steps of:
   a) collecting sets of substrate data,
   b) normalizing a value scale of the sets of substrate data,
   c) normalizing a location scale of the sets of substrate data,
   d) combining the normalized sets of substrate data into the raw substrate map,
   e) selecting a subset of substrate patterns from a set of substrate patterns,
   f) combining the subset of substrate patterns into a composite substrate map,
   g) weighting the substrate patterns in the subset of substrate patterns,
   h) comparing the composite substrate map to the raw substrate map,
   i) determining a degree of correlation between the composite substrate map and the raw substrate map,
   j) iteratively repeating steps e through i until the degree of correlation is at least a desired degree,
   k) outputting the weighted subset of substrate patterns as the component patterns of the raw substrate map, and
   l) ranking the component patterns according to their degrees of influence.

13. The method of claim 12, wherein the location scale comprises x-y coordinates on the substrate.

14. The method of claim 12, further comprising the step of ranking the component patterns according to their degree of influence.

15. The method of claim 12, wherein the degree of influence of each of the component patterns is based at least in part on the weighting used for each of the component patterns.

16. The method of claim 12, further comprising the step of associating the component patterns to processing problems.

17. The method of claim 16, further comprising the step of correcting the processing problems associated with the component patterns.

18. The method of claim 12, wherein the set of substrate patterns includes at least one of cross exposure field, radial dependency, donut, edge ring, center spot, right to left gradient, top to bottom gradient, angled top to bottom gradient, and angled bottom to top gradient.

19. The method of claim 12, wherein the comparison between the composite substrate map and the raw substrate map is an automated mathematical comparison.

20. A method for constructing a synthetic substrate map without using actual substrate processing data, the method comprising the steps of:
   a) selecting a subset of substrate patterns from a set of substrate patterns,
   b) combining the subset of substrate patterns into a composite substrate map,
   c) weighting the substrate patterns in the subset of substrate patterns,
   d) selectively adding noise to the composite substrate map, and
   e) outputting the weighted subset of substrate patterns as the synthetic substrate map.

* * * * *